(12) United States Patent
Liu et al.

(10) Patent No.: US 6,304,457 B1
(45) Date of Patent: Oct. 16, 2001

(54) MOUNTING DEVICE FOR MOUNTING A DATA STORAGE DEVICE

(75) Inventors: Alvin Liu, Pa-Li; Shao-Ming Fu, Pan-Chiao, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/337,786

(22) Filed: Jun. 22, 1999

(30) Foreign Application Priority Data

Jun. 25, 1998 (TW) .................................................. 87210204

(51) Int. Cl.⁷ .................................. H05K 7/12; H05K 9/00
(52) U.S. Cl. .......................... 361/799; 361/685; 361/753; 361/801; 174/51; 24/563
(58) Field of Search .................................... 361/724, 727, 361/752, 753, 759, 796, 797, 799, 801, 683–685; 174/51; 24/563; 206/719

(56) References Cited

U.S. PATENT DOCUMENTS

| | | | |
|---|---|---|---|
| 5,123,721 | * | 6/1992 | Seo ........................................ 312/333 |
| 5,142,447 | * | 8/1992 | Cooke et al. ........................ 361/799 |
| 5,332,306 | * | 7/1994 | Babb et al. ...................... 312/334.16 |
| 5,463,527 | * | 10/1995 | Hager et al. ........................... 361/685 |
| 5,734,557 | * | 3/1998 | McAnally et al. ................... 361/727 |
| 6,058,016 | * | 5/2000 | Anderson et al. .................... 361/727 |

FOREIGN PATENT DOCUMENTS

| | | |
|---|---|---|
| 75211381 | 4/1987 | (TW) . |
| 77203641 | 3/1989 | (TW) . |
| 78211012 | 3/1991 | (TW) . |
| 79214336 | 8/1991 | (TW) . |
| 82202204 | 8/1993 | (TW) . |
| 83202972 | 9/1994 | (TW) . |
| 83208448 | 1/1995 | (TW) . |

* cited by examiner

*Primary Examiner*—Jayprakash N. Gandhi
(74) *Attorney, Agent, or Firm*—Wei Te Chung

(57) ABSTRACT

A mounting device for mounting a data storage device to a receiving bracket of a computer enclosure includes a board body and at least one grounding clip. Two of the mounting devices are attached to opposite sides of the data storage device and engage with the receiving bracket. Each grounding clip includes a securing section, a first section and a second section. A bolt extends through a hole defined in the securing section of the grounding clip and a through hole defined in the board body for engaging with a screw hole defined in the data storage device thereby fixing the grounding clip and the board body to the data storage device. The fist and second sections of each grounding clip form a plurality of fingers for respectively contacting the data storage device and the computer enclosure thereby forming a grounding path therebetween while fixing the data storage device to the computer enclosure.

10 Claims, 5 Drawing Sheets

MOUNTING DEVICE FOR MOUNTING A DATA STORAGE DEVICE

BACKGROUND OF THE INVENTION

1. Field of the Invention

The present invention relates to a mounting device for mounting a data storage device to a computer enclosure, and particularly to a mounting device having grounding fingers for providing a grounding function and fixing the data storage device to a computer.

2. The Related Art

Data storage devices normally used in a personal computer include a hard disk drive (HDD), a floppy disk drive (FDD) and a compact disc read only memory (CD-ROM). A data storage device is often fixed in a receiving bracket of a computer by bolts. When mounting the data storage device to the computer enclosure, an assembler must align the CD-ROM with the receiving bracket with one hand and tighten the bolts with the other hand. This process is tedious and laborious. Therefore, rails are attached to both sides of a CD-ROM to simplify the installation process.

Rails made from conductive material, such as metal, promote electrostatic discharge of the data storage device. However, rails made of insulative material, such as plastic, hinder the electrostatic discharge process. An additional discharge path must be formed between the data storage device and the computer enclosure for protecting the data storage device. Conventionally, the additional discharge path constitutes a spring member engaging between the data storage device and the computer enclosure. Such a spring member has fatigue problems leading to poor engagement between the data storage device and the computer enclosure. Examples of conventional mounting devices are disclosed in U.S. Pat. Nos. 5,142,447, 5,463,527 and 5,332,306 and Taiwan Patent Application Nos. 75211381, 77203641, 78211012, 79214336, 82202204, 83202972 and 83208448.

SUMMARY OF THE INVENTION

An object of the present invention is to provide a mounting device for mounting a data storage device to a computer enclosure, comprising grounding fingers to form an effective grounding path.

Another object of the present invention is to provide a mounting device for mounting a data storage device comprising spring fingers for facilitating the process of mounting the data storage device to a computer enclosure.

In accordance with the present invention, a mounting device for mounting a data storage device to a receiving bracket of a computer enclosure comprises a board body and at least one grounding clip. Two of the mounting devices are attached to opposite sides of the data storage device and engage with the receiving bracket. Each grounding clip includes a securing section, a first section and a second section. A bolt extends through a hole defined in the securing section of the grounding clip and a through hole defined in the board body for engaging with a screw hole defined in the data storage device thereby fixing the grounding clip and the board body to the data storage device. The first and second sections of each grounding clip form a plurality of fingers for respectively contacting the data storage device and the computer enclosure thereby forming a grounding path therebetween while fixing the data storage device to the computer enclosure.

DETAILED DESCRIPTION OF THE PREFERRED EMBODIMENTS

A mounting device constructed in accordance with the present invention is used to mount a data storage device, such as a CD-ROM, an FDD or an HDD. To facilitate the description, a CD-ROM is used as an example to illustrate the function of the present invention.

Figure 1:
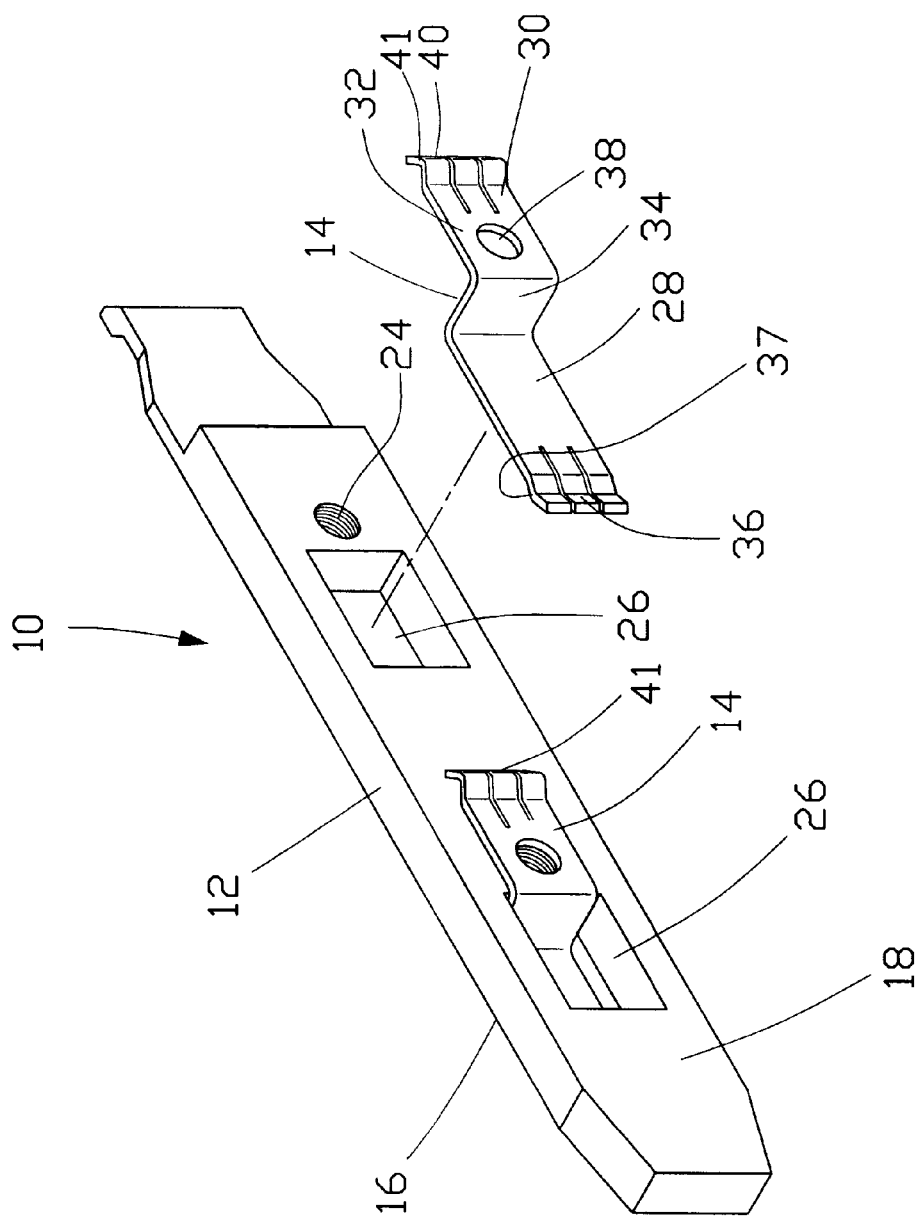
FIG. 1 is an exploded view of a mounting device in accordance with a first embodiment of the present invention.
Figure 2:
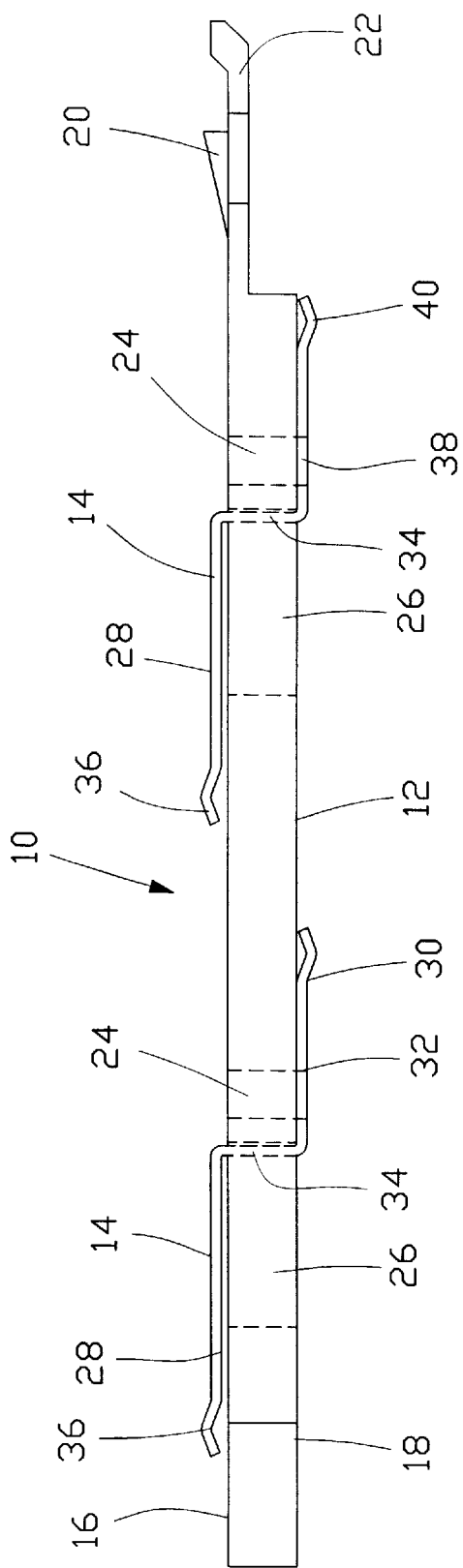
FIG. 2 is a top plan view of the mounting device.
Figure 3:
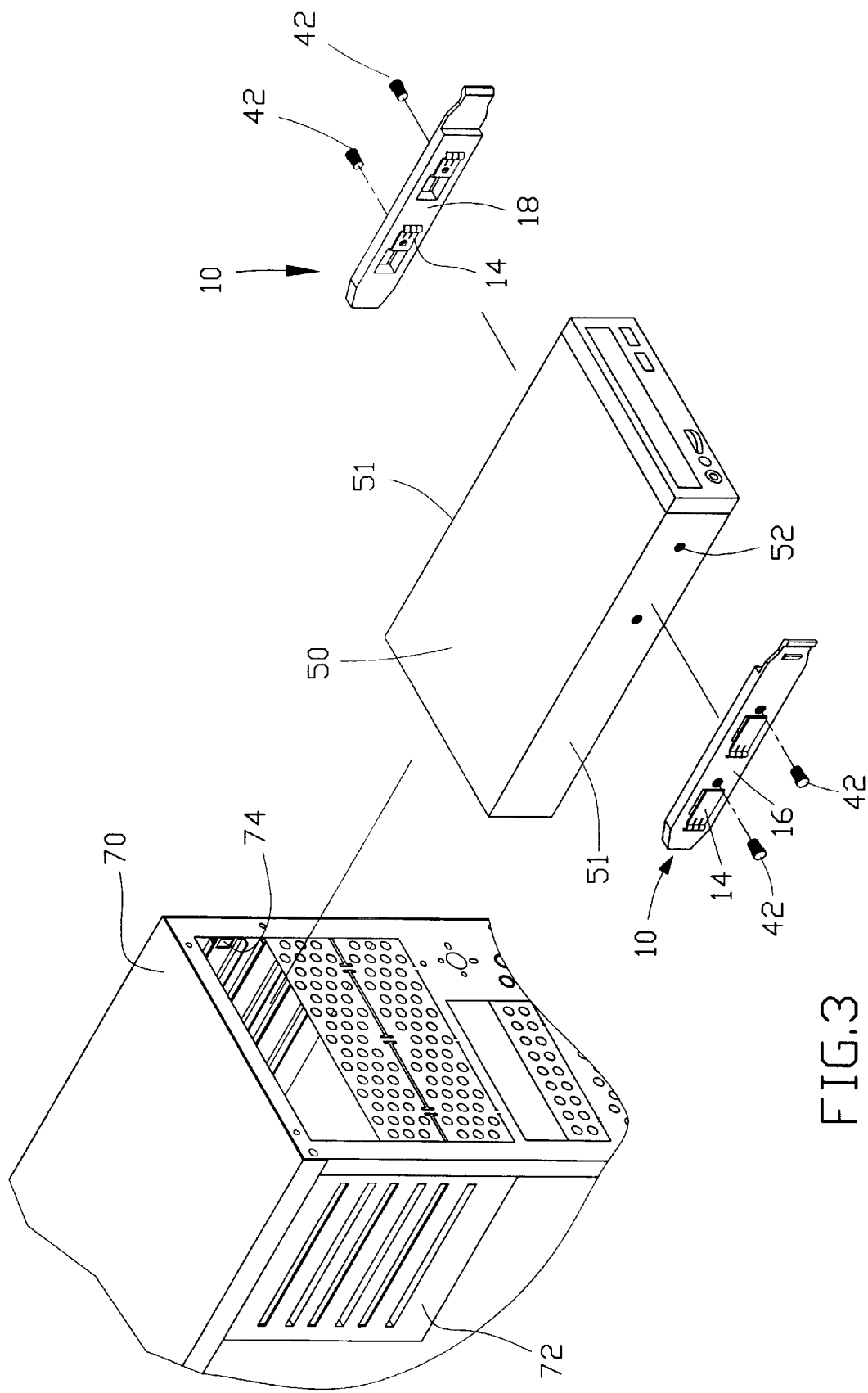
FIG. 3 is an exploded view showing a CD-ROM to be mounted to a computer enclosure by means of the mounting device of FIG. 2.

Referring to FIGS. 1–3, a pair of mounting devices 10 in accordance with a first embodiment of the present invention mount a CD-ROM 50 to a computer enclosure 70. Each mounting device 10 comprises a board body 12 and grounding clips 14. The board body 12 is a rectangular plastic board abutting against one side of the CD-ROM 50. The board body 12 has a first surface 16, an opposite second surface 18 abutting against one side 51 of the CD-ROM 50, a barb 20, a pulling portion 22, two through holes 24 and two elongate slots 26.

Each grounding clip 14 comprises a first section 28, a second section 30 and a securing section 32. The first section 28 and the securing section 32 are connected by a step 34. The first section 28 and the second section 30 each form a plurality of first and second fingers 36, 40. The first and second fingers 36, 40 form convex arcs 37, 41 at free ends thereof. The securing section 32 forms a hole 38. The step 34 is received in the slot 26 with the first section 28 abutting against the first surface 16 of the board body 12 and the second section 30 and the securing section 32 abutting against the second surface 18 of the board body 12. The hole 38 of the securing section 32 is aligned with the corresponding hole 24 of the board body 12 for receiving a bolt 42 therethrough. The bolt 42 engages with a screw hole 52 of the CD-ROM 50 for fixing the mounting device 10 to the side 51 of the CD-ROM 50. The bolts 42 can be substituted by other means. For example a plastic post can be inserted through the holes 24, 38 and interferentially fit into the screw holes 52 of the CD-ROM 50. The CD-ROM 50 slides into a mounting bracket 72 of the computer enclosure 70 with the barbs 20 of the board bodies 12 engaging with slots 74 defined in the mounting bracket 72 thereby fixing the CD-ROM 50 to the mounting bracket 72.

The fingers 36, 40 of the grounding clip 14 respectively contact the computer enclosure 70 and the CD-ROM 50 after the CD-ROM 50 is mounted in the computer enclosure 70 thereby forming a grounding path between the computer enclosure 70 and the CD-ROM 50 for electrostatic discharge purposes. Furthermore, the fingers 36, 40 provide the grounding clip 14 with compliant properties thereby facilitating smooth engagement between the CD-ROM 50 and the mounting bracket 72 of the computer enclosure 70.

Figure 4:
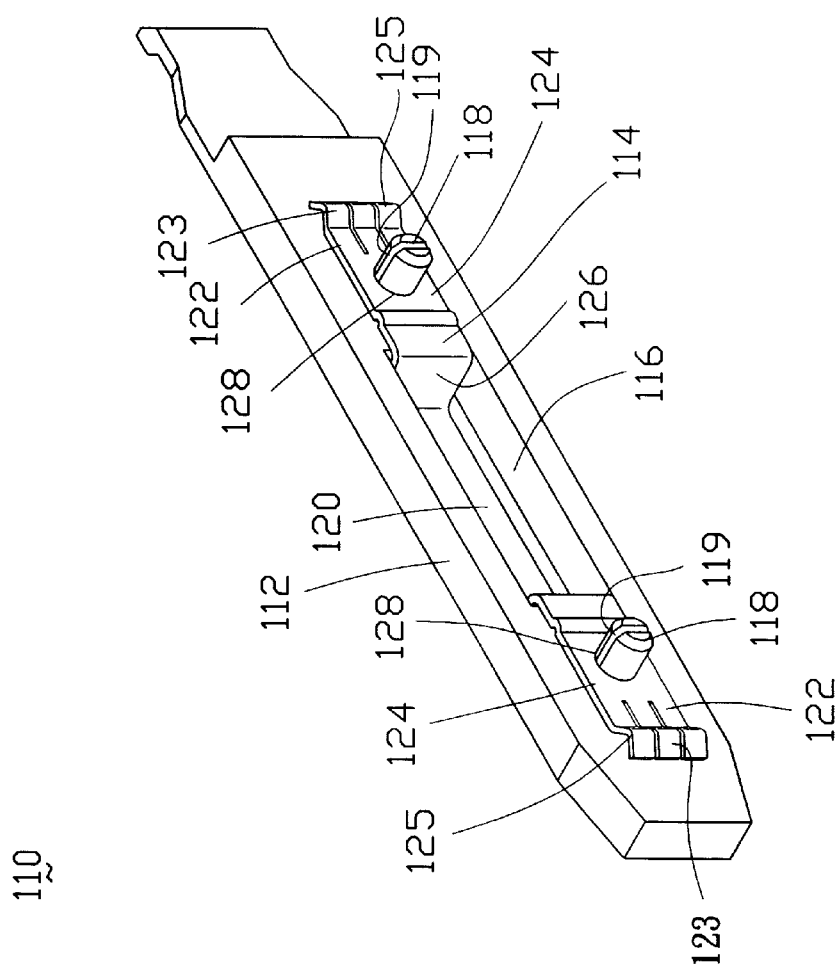
FIG. 4 is a perspective view of a mounting device in accordance with a second embodiment of the present invention.
Figure 5:
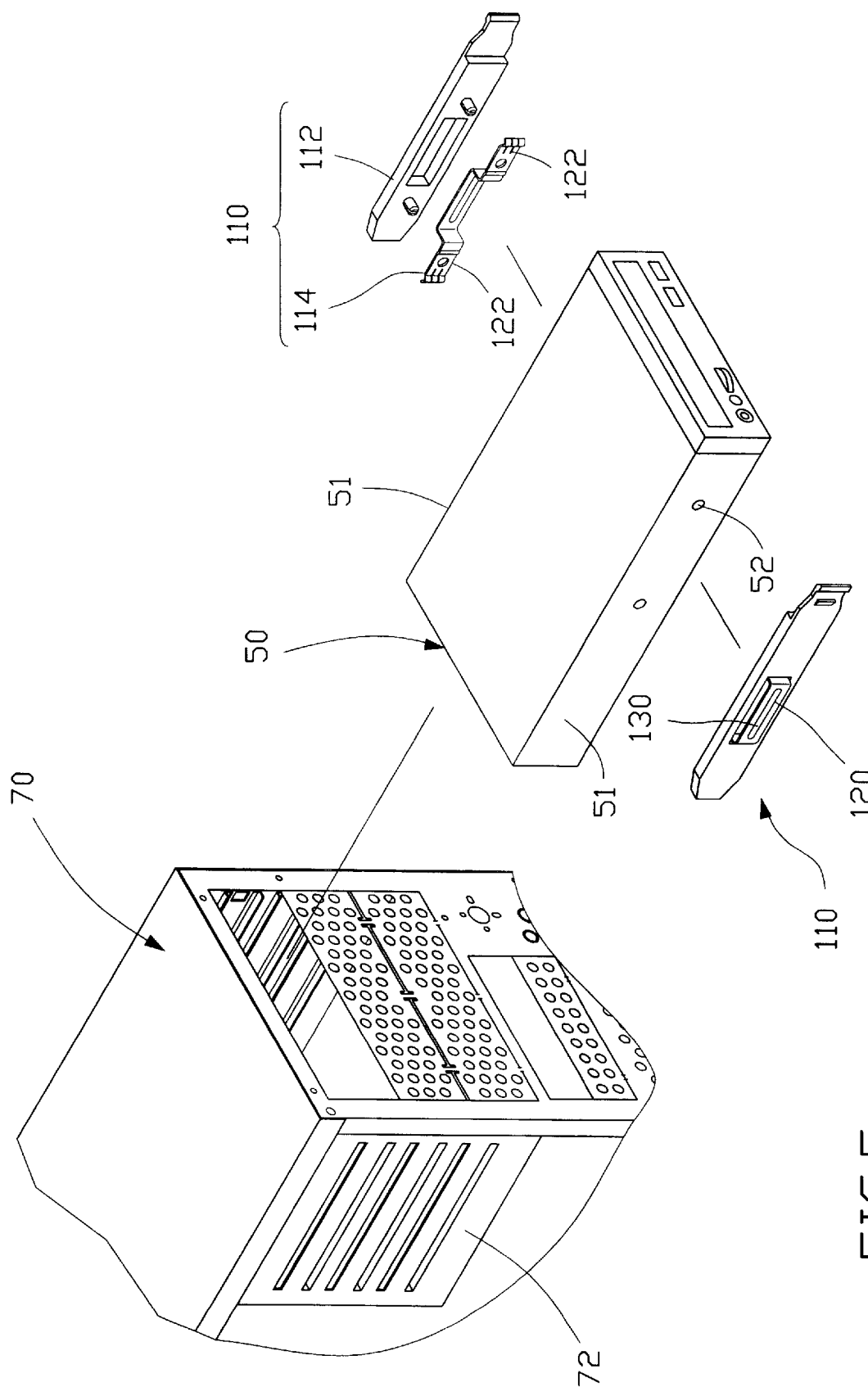
FIG. 5 is an exploded view showing a CD-ROM to be mounted to a computer enclosure by means of the mounting device of FIG. 4.

FIGS. 4 and 5 illustrate a second embodiment of the mounting device 110 of the present invention. The mounting device 110 comprises a board body 112 and a grounding clip 114. The board body 112 defines an elongate slot 116 and forms two securing posts 118 on opposite sides of the slot 116. The grounding clip 114 comprises a first section 120 and a pair of second sections 122 and securing sections 124 formed on opposite ends of the grounding clip 114. The first section 120 and the securing sections 124 are connected by steps 126. Each second section 122 forms fingers 123 each having an end convex free end 125. Each securing section 124 forms a hole 128 for extension of the corresponding securing post 118 therethrough. Each securing post 118 forms a slit 119 for facilitating engagement between the securing posts 118 and the screw holes 52 of the CD-ROM 50. Thus, the two of the mounting devices 110 are mounted to the opposite sides of the CD-ROM 50. The CD-ROM 50 is received in the mounting bracket 72 of the computer enclosure 70 with the first section 120 of the grounding clip 114 contacting the computer case 70 and the second sections 122 contacting the CD-ROM 50. The first section 120 forms a protruding rib 130 for effectively contacting the computer enclosure 70. The fingers 123 of the second sections 122 have excellent flexibility to ensure a firm contact with the CD-ROM 50 and form a grounding path for electrostatic discharge purposes.

The clips 14, 114 provide the CD-ROM 50 with an effective electrostatic discharge path and facilitate mounting the CD-ROM 50 to the computer enclosure 70.

While the present invention has been described in reference to specific embodiments thereof, the description is illustrative and is not to be construed as limiting the invention. Various modifications to the present invention may be made to the preferred embodiments by those skilled in the art without departing from the true spirit and scope of the invention as defined by the appended claims.

We claim:

1. A mounting, device mounting a data storage device in a computer enclosure, comprising:

an electrically insulative board body having a first surface engaging with the computer enclosure and an opposite second surface fixed to the data storage device, at least one slot and at least one through hole being respectively defined in the board body; and at least one conductive grounding clip mounted in the slot, the grounding clip having a first section and at least one second section extending parallel to the first section, the grounding clip forming at least one through hole therein aligned the through hole of the board body, for receiving a fastener therethrough to fix the mounting device to a corresponding side of the data storage device, wherein the first section abuts against the first surface and resiliently contacts the computer enclosure, the second section being positioned on the second surface and having a plurality of fingers contacting the data storage device thereby forming a grounding path between the data storage device and the computer enclosure.

2. The mounting device as claimed in claim 1, wherein the board body and the grounding clip each form at least one through hole aligned each other for receiving a fastener therethrough to fix the mounting device to a corresponding side of the data storage device.

3. The mounting device as claimed in claim 1, wherein each finger of the clip forms a convex portion.

4. The mounting device as claimed in claim 1, wherein the first section and the second section are connected by a step received in the slot defined in the board body.

5. The mounting device as claimed in claim 1, wherein the second section of the grounding clip forms a plurality of resilient fingers for engaging with the computer enclosure.

6. The mounting device as claimed in claim 1, wherein the second section of the grounding clip forms a protruding rib for resiliently engaging with the computer enclosure.

7. The mounting device as claimed in claim 1, wherein the grounding clip comprises two second sections formed on opposite ends of the first section.

8. The mounting device as claimed in claim 7, wherein the first section forms a protruding rib for resiliently engaging with the computer enclosure.

9. The mounting device as claimed in claim 1, wherein the board body forms at least one securing post extending through a hole defined in the grounding clip and extending into and engaging with a hole defined in the data storage device to secure the board body and the grounding clip to the data storage device.

10. The mounting device as claimed in claim 9, wherein a slit is defined in the post for facilitating the engagement between the post and the hole of the data storage device.

* * * * *